United States Patent
Wang et al.

(10) Patent No.: US 10,033,356 B2
(45) Date of Patent: Jul. 24, 2018

(54) REDUCED POWER SET-RESET LATCH BASED FLIP-FLOP

(71) Applicant: Apple Inc., Cupertino, CA (US)

(72) Inventors: Zhao Wang, San Jose, CA (US); Sheela R. Shreedharan, Milpitas, CA (US); Ajay Kumar Bhatia, Saratoga, CA (US); Michael R. Seningen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/355,109

(22) Filed: Nov. 18, 2016

(65) Prior Publication Data

US 2017/0366170 A1 Dec. 21, 2017

Related U.S. Application Data

(60) Provisional application No. 62/350,281, filed on Jun. 15, 2016.

(51) Int. Cl.
*H03K 3/012* (2006.01)
*H03K 3/3562* (2006.01)

(52) U.S. Cl.
CPC ......... *H03K 3/012* (2013.01); *H03K 3/35625* (2013.01)

(58) Field of Classification Search
CPC ............... H03K 3/012; H03K 3/35625; H03K 19/0016; H03K 23/662; H03K 3/0375; H03K 17/693; H03K 3/3562; H03K 5/04
USPC .......................... 327/199, 200, 201, 202, 203
See application file for complete search history.

(56) References Cited

U.S. PATENT DOCUMENTS

| | | | |
|---|---|---|---|
| 9,059,687 B2 | 6/2015 | Ramaraju | |
| 2009/0015321 A1* | 1/2009 | Hamdan | G01R 31/318575 327/544 |
| 2012/0182056 A1 | 7/2012 | Daily | |
| 2016/0146887 A1 | 5/2016 | Lou | |

* cited by examiner

*Primary Examiner* — John Poos
(74) *Attorney, Agent, or Firm* — Meyertons, Hood, Kivlin, Kowert & Goetzel, P.C.

(57) ABSTRACT

An apparatus includes a master latch circuit including a first circuit and a second circuit, and a slave latch circuit including a third circuit and a fourth circuit. The first circuit and the second circuit may be coupled to a first shared circuit node, and the third circuit and the fourth circuit may be coupled to a second shared circuit node. The master latch circuit may be configured to store a value of an input signal in response to an assertion of a clock signal. The slave latch circuit may be configured to store an output value of the master latch circuit in response to a de-assertion of the clock signal. The master latch circuit may also be configured to de-couple the first shared circuit node from a ground reference node in response to the de-assertion of the clock signal.

20 Claims, 7 Drawing Sheets

REDUCED POWER SET-RESET LATCH BASED FLIP-FLOP

PRIORITY INFORMATION

This application claims priority to U.S. provisional patent application Ser. No. 62/350,281, entitled "REDUCED POWER SET-RESET LATCH BASED FLIP-FLOP," filed Jun. 15, 2016, which is hereby incorporated by reference in its entirety as though fully and completely set forth herein.

BACKGROUND

Technical Field

Embodiments described herein are related to the field of integrated circuit implementation, and more particularly to flip-flop circuits.

Description of the Related Art

Integrated circuits (ICs), such as, for example, systems-on-chip (SoCs), may include a plurality of flip-flop circuits. As used herein, a "flip-flop circuit," "flip-flop," or simply "flop" refers to a circuit used to store a data bit value of an input signal. A flip-flop generally has two stable states, one of which is used to represent a logic one or logic high value and the other a logic zero or logic low value. A flip-flop may receive a clock signal to indicate when to read or sample the input signal and store the read value. Clocked flip-flops may be used to synchronize and control propagation of the input signal by limiting changes in the output of the flip-flop to occur in response to a rising or falling edge of the clock signal. The clock signal, however, may cause at least some portions of the flip-flop's circuits to consume power even while the input signal is not changing, thereby consuming power.

SUMMARY OF THE EMBODIMENTS

Various embodiments of a flip-flop circuit are disclosed. Broadly speaking, a system, an apparatus, and a method are contemplated in which the apparatus includes a master latch circuit including a first circuit and a second circuit, and a slave latch circuit including a third circuit and a fourth circuit. The first circuit and the second circuit may be coupled to a first shared circuit node, and the third circuit and the fourth circuit may be coupled to a second shared circuit node. The master latch circuit may be configured to store a value of an input signal in response to an assertion of a clock signal. The slave latch circuit may be configured to store an output value of the master latch circuit in response to a de-assertion of the clock signal. The master latch circuit may also be configured to de-couple the first shared circuit node from a ground reference node in response to the de-assertion of the clock signal.

In a further embodiment, the slave latch circuit may be further configured to de-couple the second shared circuit node from the ground reference node in response to the de-assertion of the clock signal. In another embodiment, to store the output value of the master latch circuit in response to the assertion of the clock signal, the slave latch circuit may be further configured to combine the clock signal and the output value of the master latch circuit using a logical AND function.

In one embodiment, to store the output value of the master latch circuit in response to the assertion of the clock signal, the slave latch circuit may be further configured to combine an output of the slave latch circuit and the result of the logical AND function using a logical NOR function. In another embodiment, to store the input value in response to the de-assertion of the clock signal, the master latch circuit may be further configured to combine the clock signal and the output value of the master latch circuit using a logical AND function.

In a further embodiment, to store the input value in response to the de-assertion of the clock signal, the master latch circuit may also be configured to combine the input signal and a result of the logical AND of the clock signal and the output value of the master latch circuit using a logical OR function. In another embodiment, the master latch circuit may include a transistor coupled to the first shared circuit node and the ground reference node. To de-couple the first shared circuit node from the ground reference node, the master latch circuit may be further configured to deactivate the transistor.

BRIEF DESCRIPTION OF THE DRAWINGS

The following detailed description makes reference to the accompanying drawings, which are now briefly described.

Figure 1:
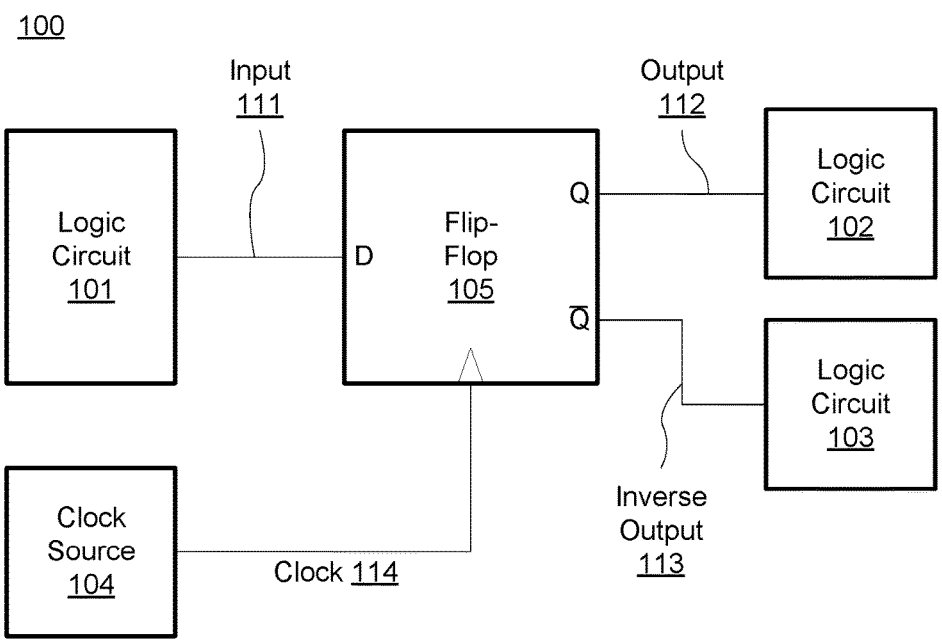
FIG. 1 depicts a block diagram of an embodiment of circuits in an integrated circuit (IC).

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In computing system, it may be desirable to store the logic state of various signals for periods of time. Latches or flip-flop circuits may be used to store the logic state of such signals. In some cases, flip-flop circuits are employed in logic paths to capture the logic states of groups of logic circuits and then forward those states onto other groups of logic circuits. In some cases, multiple flip-flops circuits may be grouped together to form a register file or other suitable storage array. Such register files may be employed to store larger amounts of data in a similar fashion to a memory.

Flip-flop circuits may depend on a state of clock signal in order to determine when data is to be stored. As such, the more flip-flop circuits that are employed within a computing system, the larger the load on a clock generator circuit. To compensate for the larger load, larger driver circuits may be employed in both the clock generator circuit as well as within a clock distribution network, resulting in an increase in area and power consumption. The embodiments illustrated in the drawings and described below may provide techniques for storing data in a flip-flop circuit while minimizing the impact on are and power consumption.

Many terms commonly used in the design of ICs are referenced below in description of the illustrated embodiments. For the sake of clarity, the following is a glossary of terms used in the present application:

A Metal-Oxide Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. In addition, the term transconductance is used in parts of the disclosure. While CMOS logic is used in the examples, it is noted that any suitable digital logic process may be used for the circuits described in this disclosure.

It is noted that "high," "high level," and "logic high" refer to a voltage sufficiently large to turn on a n-channel MOSFET and turn off a p-channel MOSFET while "low," "low level," and "logic low" refer to a voltage that is sufficiently small enough to do the opposite. As used herein, a "logic signal" refers to a signal that transitions between a high logic level and a low logic level. In various other embodiments, different technology may result in different voltage levels for "low" and "high."

The embodiments illustrated and described herein may employ CMOS circuits. In various other embodiments, however, other suitable technologies may be employed.

A block diagram of an embodiment of circuits in an integrated circuit (IC) is illustrated in FIG. 1. In the illustrated embodiment, IC 100 includes three logic circuits, 101-103, clock source 104, and flip-flop 105. Logic circuit 101 is coupled to an input of flip-flop 105 via input signal 111. Flip-flop 105 generates output signal 112 coupled to logic circuit 102 and inverse output signal 113 coupled to logic circuit 103. Flip-flop 105 also receives clock signal 114 from clock source 104.

Logic circuits 101-103 may correspond to any suitable circuits used in an IC. For example, logic circuits 101-103 may correspond to circuits in a processor, a memory controller, a serial interface, and other like circuits. Clock source 104 may correspond to any suitable clock generation circuit, such as, e.g., a phase-locked loop, a frequency-locked loop, a crystal oscillator, and the like. In the present embodiment, logic circuit 101 generates input signal 111 which is received by flip-flop 105. Flip-flop 105 stores a value of input signal 111 dependent upon clock signal 114 from clock source 104. It is noted that a clock distribution network (not shown) may be employed, in various embodiments, to distribute clock signal 114 to flip-flop 105, other flip-flop circuits, and other circuits employing clock signal 114.

In various embodiments, flip-flop 105 may capture a state of input signal 111 in response to a rising edge (i.e., when clock signal 114 transitions from a logic low to a logic high), a falling edge (i.e., when clock signal 114 transitions from a logic high to a logic low), or either edge of clock signal 114. As used herein, the edge of clock signal 114 that triggers capturing the state of input signal 111 is referred to the "active edge."

Flip-flop 105 generates output signal 112 with a value equivalent to the captured state of input signal 111. In addition, flip-flop 105 generates inverse output signal 113 with a value opposite of output signal 112. The values of output signal 112 and inverse output signal 113 remain unchanged despite changes in the state of input signal 111 until a next active clock edge is received.

It is noted that the IC illustrated in FIG. 1 is merely an example. In other embodiments, different circuit blocks, different numbers of circuit blocks, and different configurations of circuit blocks may be possible dependent upon the specific application for which the IC is intended.

Figure 2:
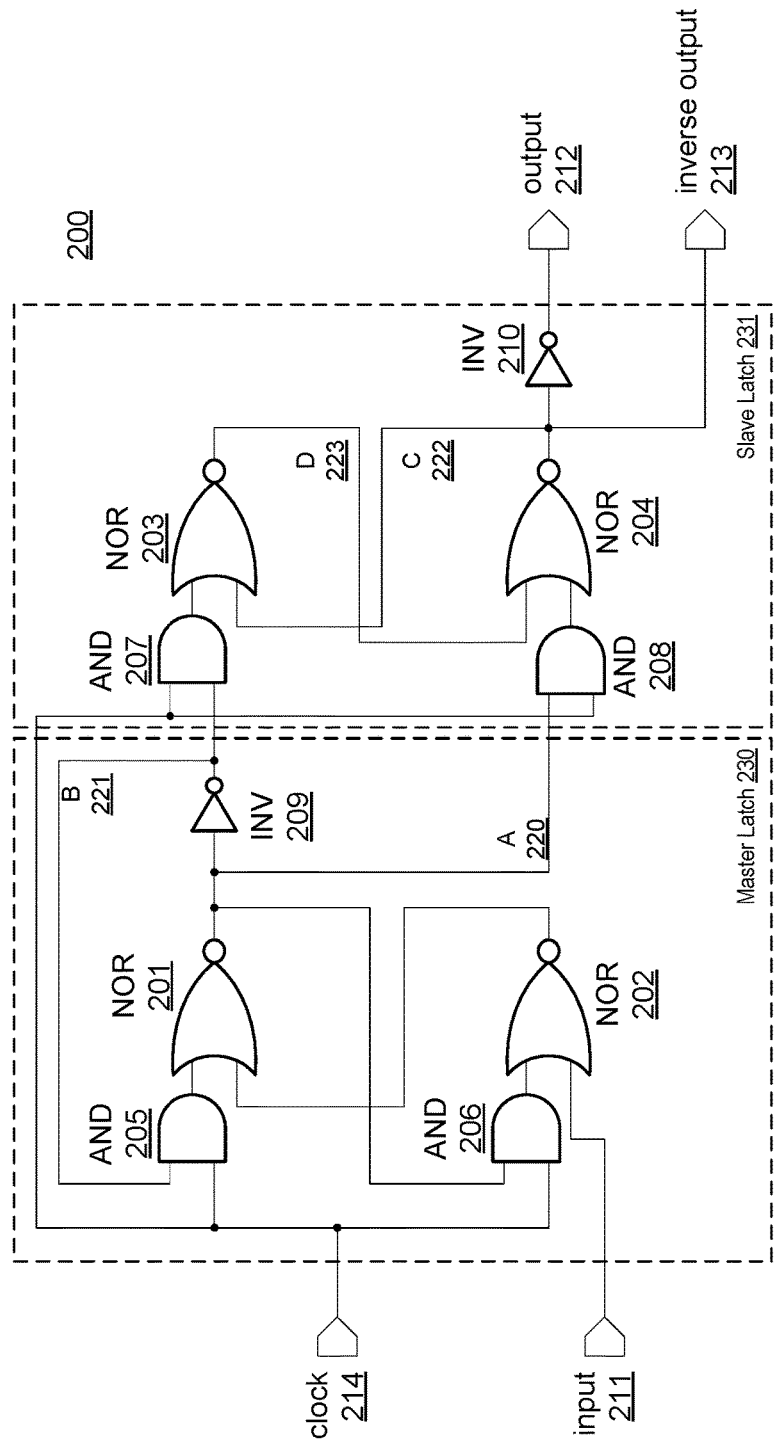
FIG. 2 illustrates a block diagram of an embodiment of a flip-flop circuit.

Turning to FIG. 2, a block diagram of an embodiment of a flip-flop circuit is illustrated. In some embodiments, flip-flop 200 may correspond to flip-flop 105 of FIG. 1. The illustrated embodiment of flip-flop 200 includes four NOR gates, NOR 201 through NOR 204, four AND gates, AND 205 through AND 208, and two inverter gates, INV 209 and INV 210. Flip-flop 200 receives input signal 211 and clock signal 214. Flip-flop 200 generates output signal 212 and inverse output signal 213.

Input signal 211 is coupled to one input of NOR 202 while the output of AND 206 is coupled to a second input of NOR 202. Clock signal 214 is coupled to one input of each of AND 205 through AND 208. The output of NOR 201 is coupled to a second input of AND 206. The output of NOR 202 is coupled to an input of NOR 201. The output of AND 205 is coupled to a second input of NOR 201. The output of NOR 201 is coupled to the input of INV 209. A second input of AND 205 is coupled to the output of INV 209. NOR 201, NOR 202, AND 205, AND 206, and INV 209 are collectively referred to herein as master latch 230.

Master latch 230, in one embodiment, receives the state of input signal 211 while clock signal 214 is low. As referred to herein, clock signal 214, as well as other clock signals disclosed herein, are referred to as "de-asserted" when in a low state and "asserted" when in a high state. While clock signal 214 is de-asserted, outputs of AND 205 and AND 206 will be low, regardless of the second inputs to each AND gate. With the output of AND 206 low, the output of NOR 202 is dependent on input signal 211. If input signal 211 is low, then the output of NOR 202 is high, and vice versa. The output of NOR 201 is subsequently dependent on the output of NOR 202. If the output of NOR 202 is high, then the output of NOR 201 is low, and the reverse is true if the output of NOR 202 is low.

In the illustrated embodiment, when clock signal 214 transitions from the de-asserted state to the asserted state, the value of input signal 211 is stored on circuit node A 220 and the inverse value of input signal 211 is stored on circuit node B 221. The outputs of AND 205 and AND 206 prevent the output of NOR 201 from changing while clock signal 214 is asserted. AND 205 receives the value stored on node B 221 and AND 206 receives the value stored on node A 220. Since nodes A 220 and B 221 will be opposite due to INV 209, either AND 205 or AND 206 will output a high. The high output of this AND gate will hold the corresponding NOR gate low, regardless of the value of input signal 211.

The values stored on nodes A 220 and B 221 are received, in one embodiment, by slave latch 231. Slave latch 231 includes AND 207 and AND 208 coupled to NOR 203 and NOR 204, respectively. Outputs of NOR 203 and NOR 204 are cross-coupled to an input of the other NOR gate. In addition, the output of NOR 204 is coupled to INV 210. The output of INV 210 generates output signal 212.

When clock signal 214 is asserted, the values of nodes A 220 and B 221 are latched in master latch 230 and are allowed to propagate through slave latch 231. The output of AND 207 may transition to the value of node B 221 and the output of AND 208 may transition to the value of node A 220. Again, since the value of B 221 is the inverse of the value of node A 220, either AND 207 or AND 208 will have a high output. The AND gate that has the high output will force the output of the corresponding NOR gate to be low. If the output of AND 207 is high, then the output of NOR 203 (also identified in the illustration as node D 223) will be low. The low value of node D 223 is input into NOR 204. The low outputs from AND 208 and NOR 203 cause the output of NOR 204 to be high. The high output of NOR 204 is input into INV 210 which, in turn, generates a low output for output signal 212. The low value of output signal 212 corresponds to a low value of input 211 latched in master latch 230 at the last rising edge of clock 214. When clock signal 214 is de-asserted, the values on nodes C 222 and D 223 are latched in slave latch 231.

Conversely, if, in the illustrated embodiment, the output of AND 208 is high, then the output of NOR 204 (also identified as node C 222) will be low. The low value of node C 222 is input into NOR 203. The low outputs from AND 207 and NOR 204 cause the output of NOR 203 to be high. The low output of NOR 204 is input into INV 210 which, in turn, generates a high output for output signal 212. The high value of output signal 212, accordingly, corresponds to a high value of input 211 latched in master latch 230 at the last rising edge of clock 214. The value of node C 222 may be output from flip-flop 200 as inverse output signal 213. As before, when clock signal 214 is de-asserted, the values on nodes C 222 and D 223 are latched in slave latch 231.

It is noted that, to improve clarity and to aid in demonstrating the disclosed concepts, the block diagram illustrated in FIG. 2 has been simplified. In other embodiments, different and/or additional circuit elements are possible and contemplated.

Figure 3:
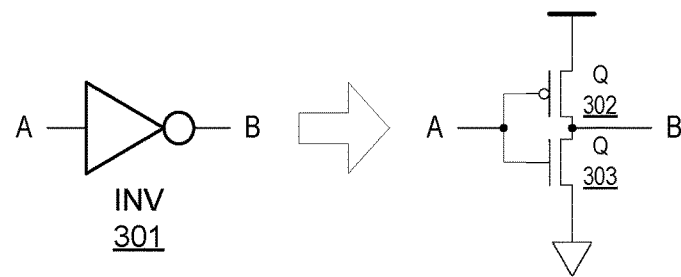
FIG. 3 shows a circuit diagram of an embodiment of an inverter circuit.
Figure 4:
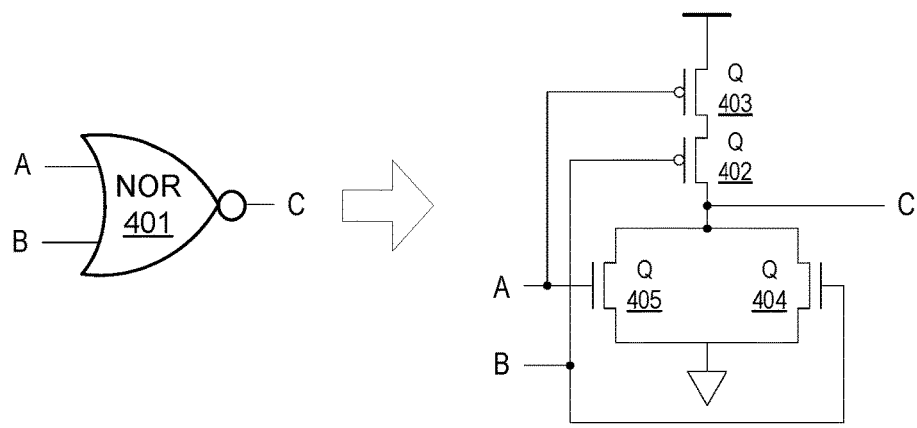
FIG. 4 illustrates a circuit diagram of an embodiment of a NOR circuit.
Figure 5:
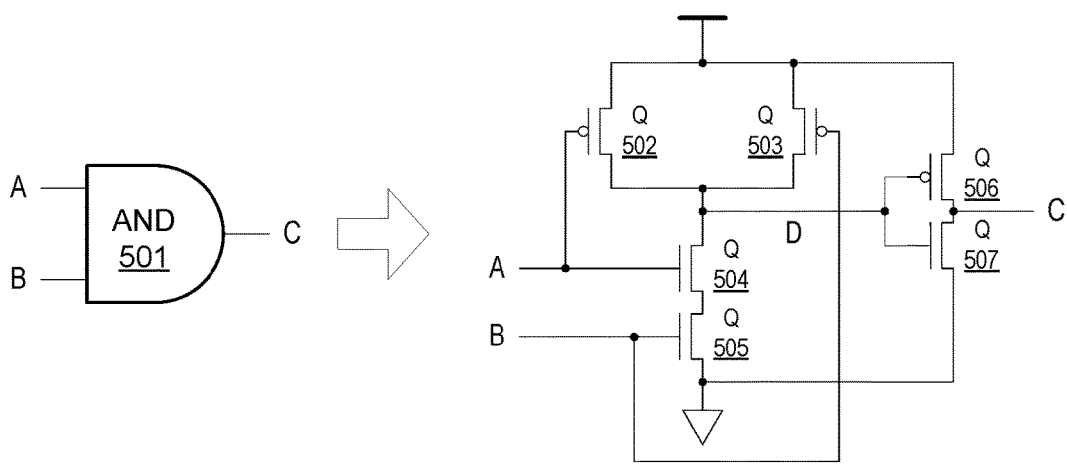
FIG. 5 depicts a circuit diagram of an embodiment of an AND circuit.

FIGS. 3-5 illustrate circuit diagrams for embodiments of an inverter gate, a NOR gate, and an AND gate, respectively. In each of FIGS. 3-5, a gate symbol is illustrated to the left of an arrow with inputs and outputs labeled with letters A, B, and C. An example circuit is shown to the right of the respective arrow with the inputs and outputs labeled with the same letters.

In FIG. 3, a circuit diagram of an embodiment an inverter gate, INV 301, is shown. In the illustrated embodiment, INV 301 receives input A and generates output B with a value inverse of the value of input A. The corresponding circuit includes devices Q 302 and Q 303, in what may be referred to as a stacked configuration, with device Q 302 on top and device Q 303 on the bottom. It is noted that, in various embodiments, device Q 302 may be implemented as a p-channel MOSFET and device Q303 may be implemented as an n-channel MOSFET. Input A is coupled to the control gates of each device. When input A is high, Q 302 is disabled, de-coupling output B from a power supply node. Additionally, Q 303 is enabled, coupling output B to a ground reference node, resulting in a low value for output B, i.e., the inverse of input A. When input A is low, the opposite is true. Q 302 is enabled, coupling output B to the power supply node and Q 303 is disabled, de-coupling output B from the ground reference node. Output B is therefore high, opposite of the low value of input A.

An embodiment of a NOR gate, NOR 401, is illustrated in FIG. 4. NOR 401 receives inputs A and B and generates output C. The value of output C is high when the value of both inputs A and B are low, and is low for all other combinations of inputs A and B. The corresponding circuit in the illustrated embodiment includes devices Q 402 through Q 405. In some embodiments, devices Q 402 and Q 403 may correspond to p-channel transistors, and devices Q 404 and Q 405 may correspond to n-channel transistors. Input A is coupled to the control gates of Q 403 and Q 405, while input B is coupled to Q 402 and Q 404. When the values of both inputs A and B are low, then both Q 403 and Q 402 are enabled, coupling output C to a power supply node. Furthermore, both Q 404 and Q 405 are disabled, de-coupling output C from a ground reference node. Conversely, if the value of either input A or B, or both, is high, then the respective device Q 403, or Q 402, or both, are disabled, de-coupling output C from the power supply node. Additionally, either Q 405, or Q 404, or both, is enabled, coupling output C to the ground reference node.

FIG. 5 shows an embodiment of an AND gate, AND 501. AND 501 receives inputs A and B, and generates output C. The value of output C is high when the values of both inputs A and B are high, and low for other combinations of input values. The corresponding circuit includes devices Q 502 through Q 507. In some embodiments, devices Q 502, Q 503 and Q 506 may correspond to p-channel transistors, and devices Q 504, Q 505, and Q 507 may correspond to n-channel transistors. Similar to the NOR gate of FIG. 4, input A is coupled to the control gates of Q 502 and Q 504, while input B is coupled to the control gates of Q 503 and Q 505. An intermediate node, labeled "D," is coupled to the control gates of Q 506 and Q 507. It is noted that devices Q

506 and Q 507 form an inverter gate as shown in FIG. 3, such that the value of output C is the inverse of the value of node D.

When the values of inputs A and B are high, both Q 504 and Q 505 are enabled and both Q 502 and Q 503 are disabled, de-coupling node D from a power supply signal and coupling node D to a ground reference node, resulting in a low value for node D. The inverter gate formed by Q 506 and Q 507 inverts the low value of node D to generate a high value for output C. Any other combination of values for inputs A and B results in at least Q 502 and/or Q 503 being enabled and coupling node D to the power supply node, while at least one of Q 504 and Q 505 is disabled, de-coupling node D from the ground reference node. The resulting high value of node D is inverted to generate a low value for output C.

It is noted that, although the present embodiment includes MOSFETs as circuit elements, other transistor technologies are known and contemplated. The MOSFET terminals identified herein as "control gate" may be substituted with corresponding terminals included in other transistor types by a person skilled in the art.

It is also noted that the gate circuits illustrated in FIGS. 3-5 are merely examples. The circuit diagrams include sufficient elements for demonstrating the disclosed concepts. In other embodiments, additional circuit elements may be included and/or elements may be arranged in different configurations. Furthermore, the placement of the circuit elements in FIGS. 3-5 is not intended to imply an actual location of the elements in physical embodiments of the circuit.

Figure 6:
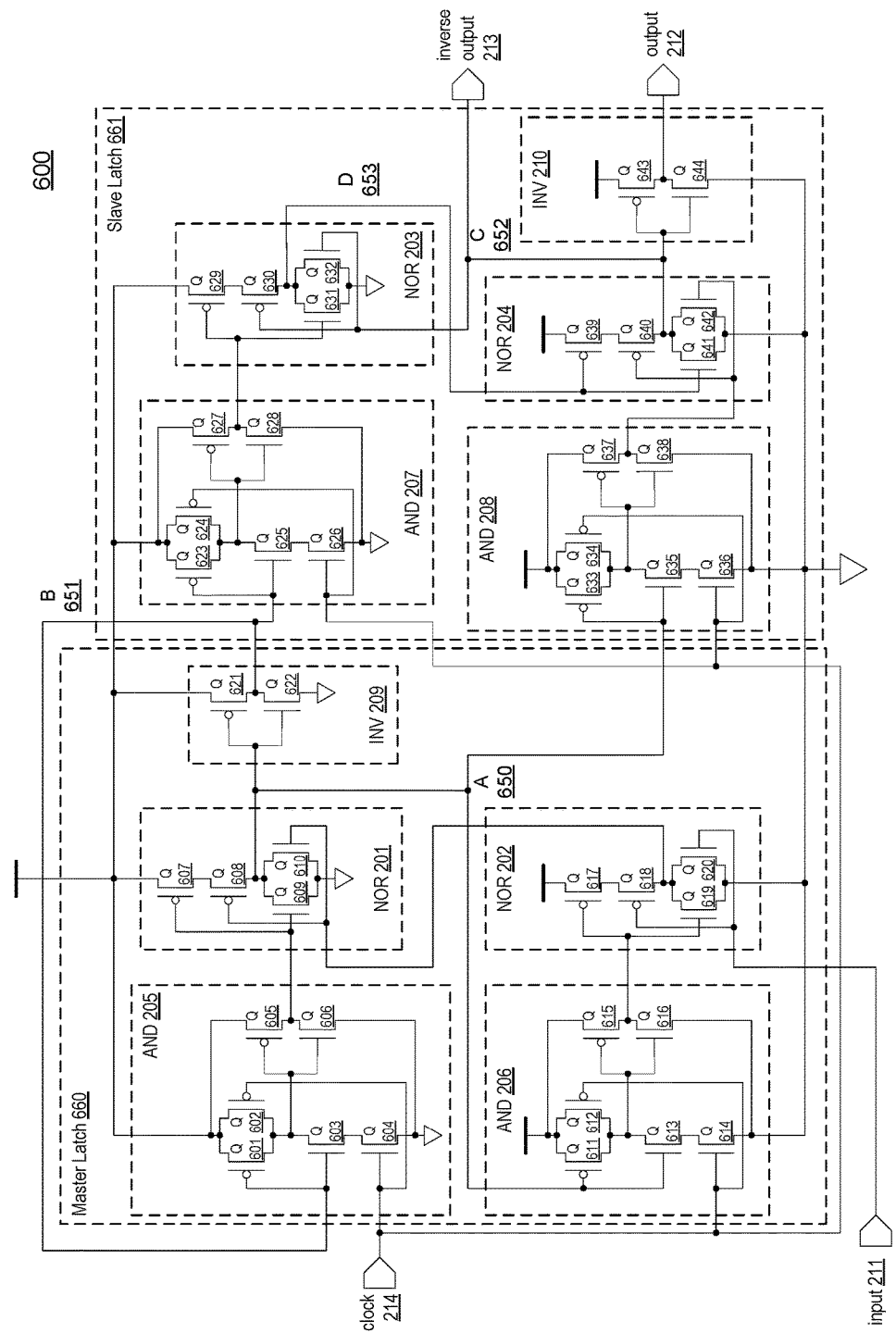
FIG. 6 shows a circuit diagram of a first embodiment of FIG. 2 utilizing the circuits of FIGS. 3-5.

Moving to FIG. 6, a circuit diagram of one embodiment of a flip-flop circuit. In the illustrated embodiment, flip-flop 600 may correspond to flip-flop 200 in FIG. 2. Flip-flop 600 includes forty-four devices, Q 601 through Q 644. In some embodiments, the devices in flip-flop 600 may correspond to n-channel and p-channel MOSFETs. The circuits shown in FIGS. 3-5 have been substituted for the corresponding blocks shown in FIG. 2, with the dashed-line boxes identifying the respective block from FIG. 2. In addition, internal nodes A 650, B 651, C 652, and D 653 are labeled for reference.

The operation of flip-flop 600 may, in various embodiments, be similar to operation described above for flip-flop 200. The operation of the individual gate circuits may be the same as described above in regards to FIGS. 3-5. Flip-flop 600 includes circuits to implement master latch 660 and slave latch 661, which, in the illustrated embodiment, correspond to master latch 230 and slave latch 231 in flip-flop 200. Master latch 660 includes devices 601 through 622, while slave latch 661 includes devices Q 623 through Q 644.

It is noted that clock signal 214 is coupled to the control gates of eight devices, Q 602, Q 612, Q 624, Q 634, Q 604, Q 614, Q 626, and Q 636. In some ICs, a clock signal may toggle at high frequencies and may be active for a significant amount of time while the IC is powered on and enabled. Clock signal 214 may, therefore, generate frequent transitions on the eight indicated transistors, which may contribute to a large portion of power consumption of flip-flop 600, particularly when input signal 211 is not changing frequently.

It is noted that the circuit illustrated in FIG. 6 is an example for demonstrating disclosed concepts. In other embodiments, additional and/or different circuit elements may be utilized.

Figure 7:
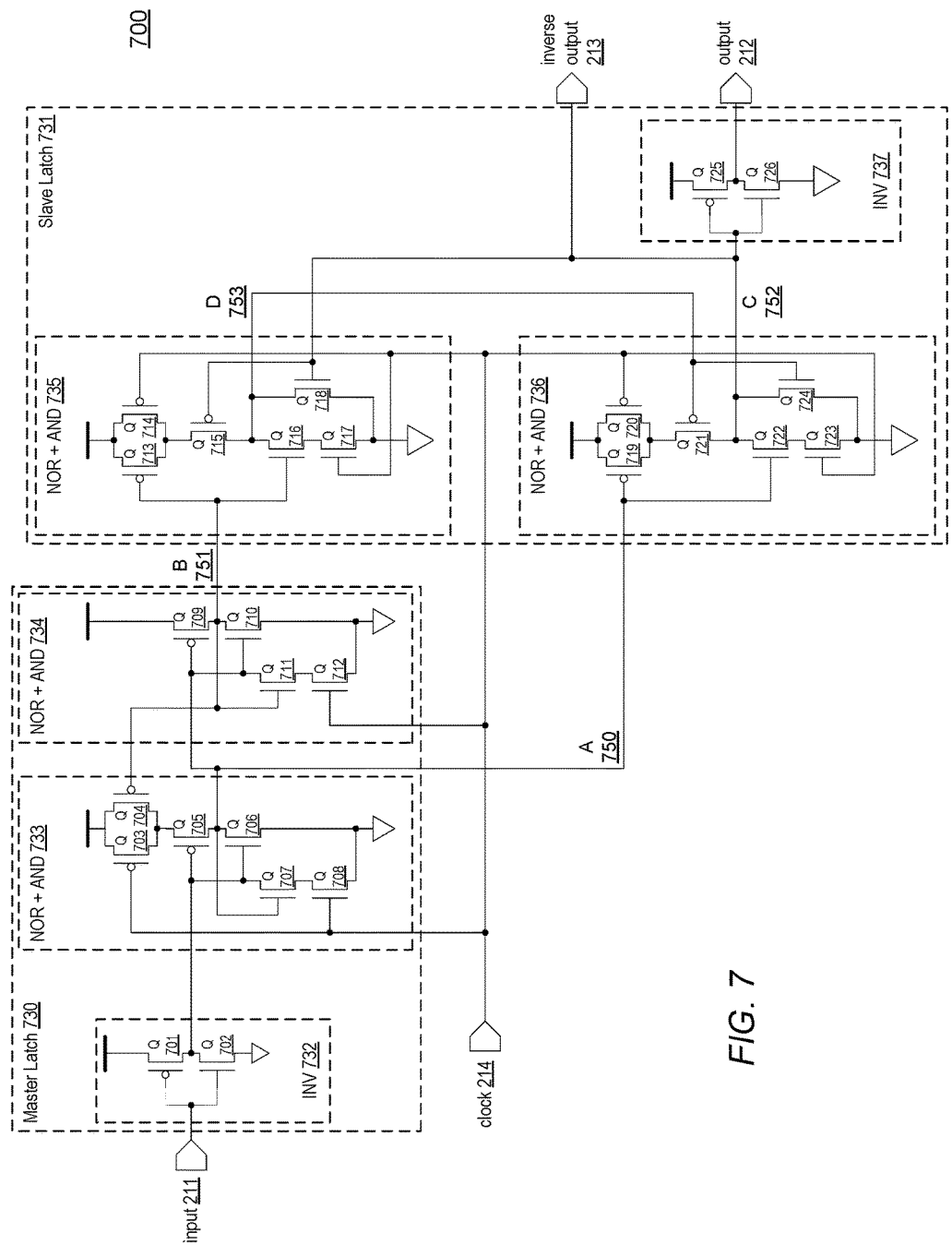
FIG. 7 depicts a circuit diagram of another embodiment of FIG. 2 with some circuit size reductions.

Turning now to FIG. 7, a circuit diagram of another embodiment of a flip-flop circuit is shown. Flip-flop 700, in the illustrated embodiment, may correspond to flip-flop 200 in FIG. 2. Flip-flop 700 includes Master Latch 730, Slave Latch 731, and devices Q 701 through Q 726. In some embodiments, the devices in flip-flop 700 may correspond to n-channel and p-channel MOSFETs.

In comparison to flip-flop 600, flip-flop 700 utilizes fewer devices, 26 devices in flip-flop 700 versus 44 in flip-flop 600. This reduction in device count may be accomplished by combining individual circuits for AND and NOR gates into a single circuit and yet provide similar functionality. For example, the circuits to create AND 206 and NOR 202 in FIG. 6, which includes devices Q 611 through Q 620, can be replaced with the circuit including devices Q703 through Q 708, identified by the dashed box labeled NOR+AND 733. Furthermore, the circuits used to create NOR 203 and AND 207 in FIG. 6 use devices Q 623 through Q 632. In flip-flop 700, similar functionality may be achieved with the circuit created with devices Q 713 through Q 718, indicated by the dashed box labeled NOR+AND 735.

It is noted that the number of devices employed in the embodiment illustrated in FIG. 6 may allow reduced power consumption as well as to a reduced IC chip size in comparison to other embodiments. In addition, the reduced load on clock signal 214 may provide further reduction in power consumption.

It is noted that FIG. 7 illustrates an example circuit of an embodiment of a flip-flop. Placement of the circuit elements in FIG. 7 is not intended to imply a physical location of the elements in the circuit. The elements of the circuit in FIG. 7 may be arranged in differently in other embodiments.

Figure 8:
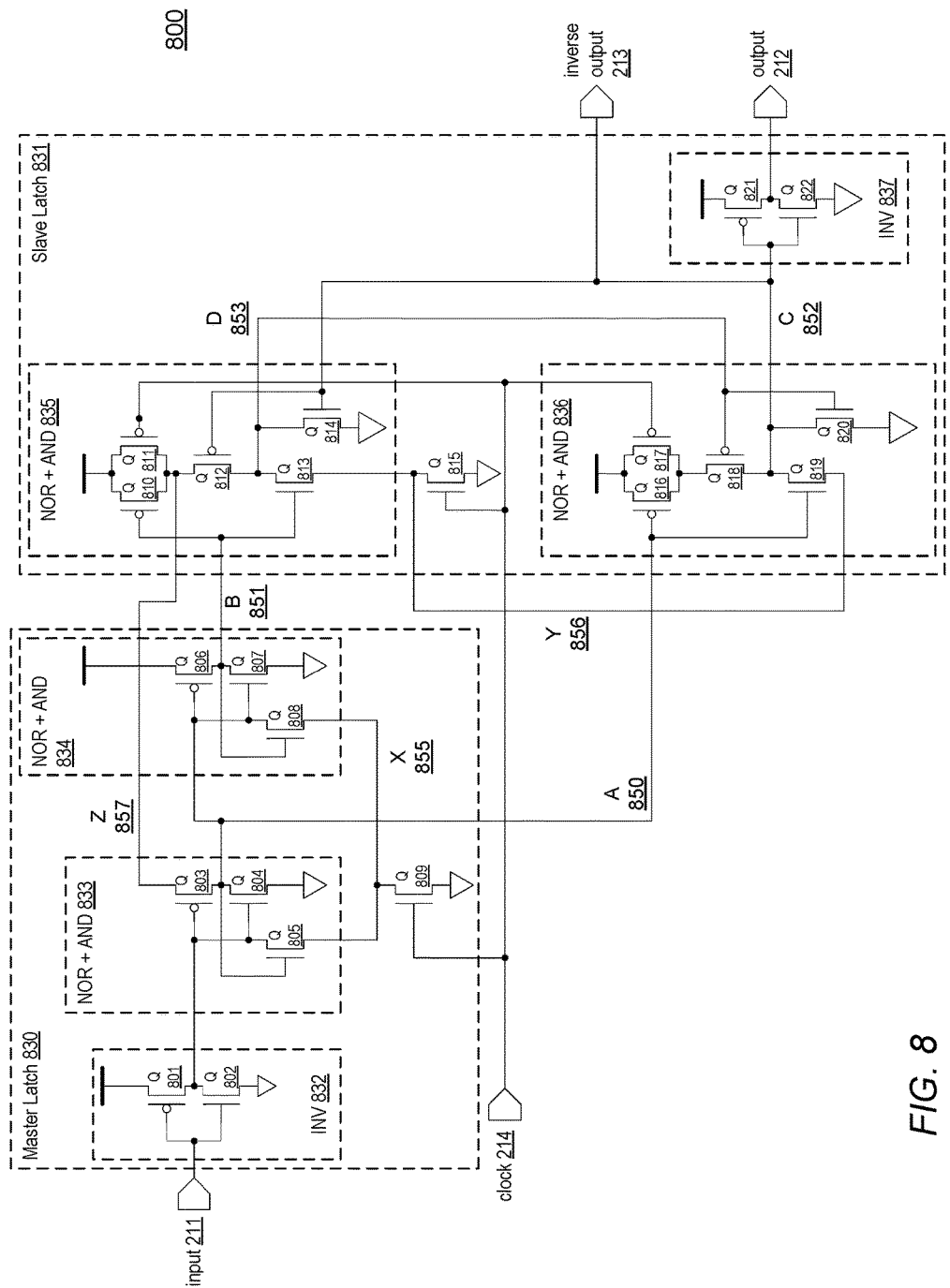
FIG. 8 illustrates a circuit diagram of a third embodiment of FIG. 2 with additional circuit size reductions.

Moving now to FIG. 8, a circuit diagram of another embodiment of a flip-flop circuit is illustrated. Flip-flop 800 may provide further reductions in power consumption and area through reduced device count. Flip-flop 800, in the illustrated embodiment, may correspond to flip-flop 200 as depicted in FIG. 2. Flip-flop 800 includes Master Latch 830, Slave Latch 831, and devices Q 801 through Q 822. As also described above, the devices in flip-flop 800 may, in some embodiments, correspond to n-channel and p-channel MOSFETs.

In the illustrated embodiment, three shared nodes are used to reduce a number of devices coupled to clock signal 214, shared nodes X 855, Y 856, and Z 857. Q 805 and Q 808 are coupled to shared node X 855 that is then coupled to the ground reference node via Q 809 when clock signal 214 is asserted. Q 813 and Q 819 are coupled to shared node Y 856 that is then coupled to the ground reference node via Q 815 when clock signal 214 is asserted. In addition, Q 803 and Q 812 are coupled to shared node Z 857. Shared node 857 is then coupled to a power supply node via Q 810 when node B 221 is low or via Q 811 when clock signal 214 is de-asserted.

In the embodiment of flip-flop 800, clock signal 214 is coupled to the control gates of only four devices (Q 809, Q 815, Q 811, and Q 817). The reduced load on clock signal 214 may, therefore, result in lower power consumption and less chip area than other flip-flop embodiments.

It is noted that the circuit shown in FIG. 8 depicts an example embodiment of a flip-flop. In other embodiments, the elements of the circuit in FIG. 8 may be arranged in differently.

Figure 9:
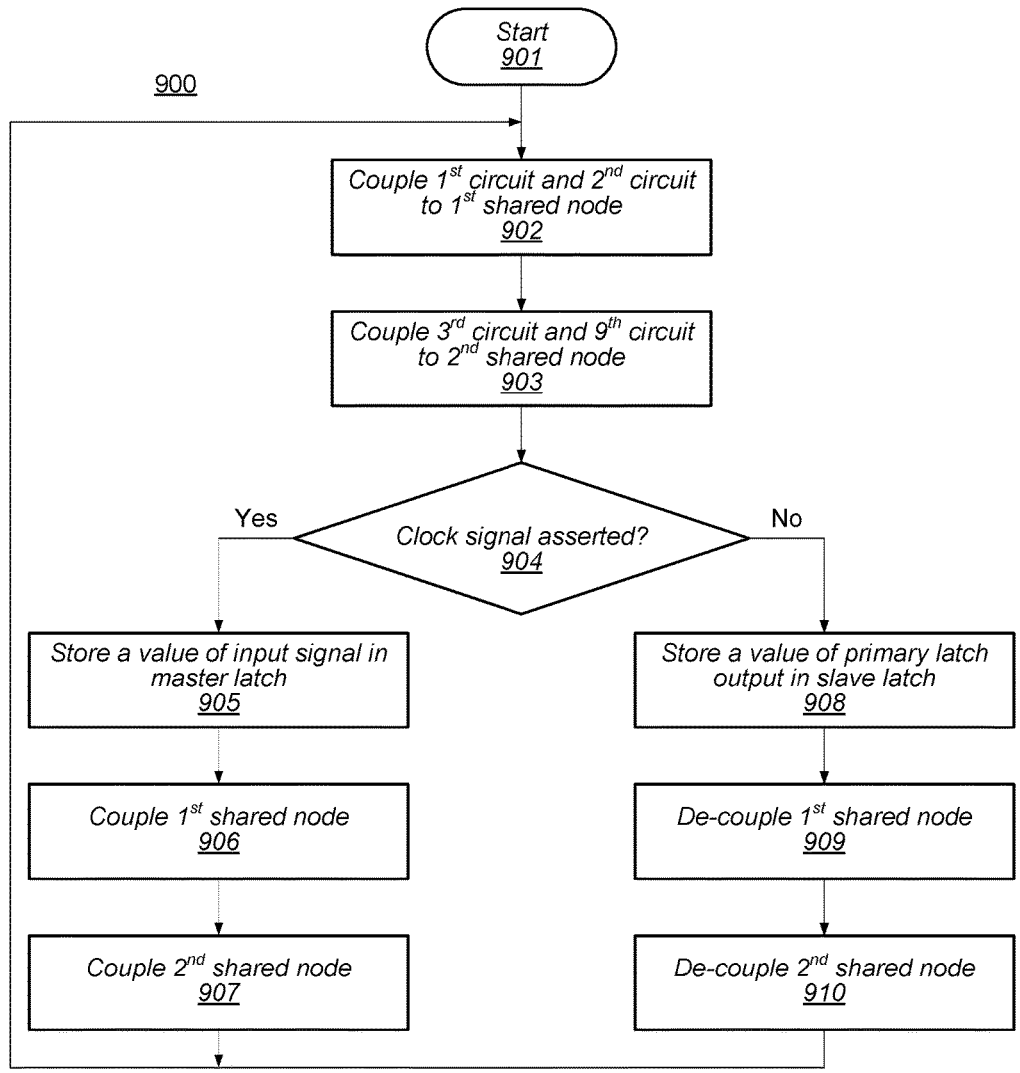
FIG. 9 illustrates a flow diagram of an embodiment of a method for operating a flip-flop circuit.

Turning to FIG. 9, a flow diagram of an embodiment of a method for operating a flip-flop circuit is shown. Method 900 may be applied to a flip-flop circuit such as, for example, flip-flop 800 in FIG. 8. Referring collectively to flip-flop 800 and the flow diagram of FIG. 9, the method begins in block 901.

A first circuit and a second circuit are coupled to a first shared node (block 902). Circuitry included in NOR 202+AND 206 is coupled to shared node X 225 via Q 805. In a similar manner, circuitry included in NOR 201+AND 205 is coupled to shared node X 225 via Q 808.

A third circuit and a fourth circuit are coupled to a second shared node (block 903). Similar to as described for shared node X 225, circuitry included in NOR 203+AND 207 is coupled to shared node Y 226 via Q 819. Likewise, circuitry included in NOR 204+AND 208 is coupled to shared node Y 226 via Q 813.

Further operations of method 900 may depend upon a state of a clock signal (block 904). In the present embodiment, clock signal 214 is received by flip-flop 800, and is considered asserted when high and de-asserted when low. In other embodiments, clock signal 214 may be inverted such that a low state corresponds to an assertion and a high state corresponds to a de-assertion. If clock signal 214 is asserted, then the method moves to block 905 to store a value of input signal 211 in master latch 230. Otherwise, the method moves to block 908 to store a value of the output of master latch 230 in slave latch 231.

If the clock signal is asserted, then a value of an input signal is stored in a master latch (block 905). In response to an assertion of clock signal 214, a value of input signal 211 is stored in master latch 230. Node A 220 corresponds to the value of input signal 211. While clock signal 214 is de-asserted, the state of node A 220 may change in response to changes in the value of input signal 211. When clock 214 is asserted, the value of input signal 211 is captured and stored in response to the transition of clock signal 214 from the de-asserted state to the asserted state. Changes in the value of input signal 211 may not change the value stored on node A 220 while clock signal 214 is asserted.

The first shared node is coupled to a ground reference node (block 906). Shared node X 225 is coupled to the ground reference node, via device Q 809 while clock signal 214 is asserted. The coupling of shared node X 225 to the ground reference node may contribute to master latch 230 storing the value of input node 211.

The second shared node is coupled to the ground reference node (block 907). Likewise, shared node Y 226 is coupled to the ground reference node, via device 815 while clock signal 214 is asserted. While shared node Y 226 is coupled to the ground reference node, changes to the outputs of master latch 230 may be allowed to propagate through slave latch 231.

If the clock signal is de-asserted, then a value of an output of the master latch is stored in a slave latch (block 908). In response to a de-assertion of clock signal 214, a value of an output of master latch 230 is stored in slave latch 231. Node D 223 corresponds to a value of node A 220, which, in turn, corresponds to the value stored in master latch 230. While clock signal 214 is asserted, the state of node D 223 may change in response to changes in the value of node A 220. When clock 214 is de-asserted, the value of node A 220 is captured and stored in response to the transition of clock signal 214 from the asserted state to the de-asserted state. Changes in the value of node A 220 may not change the value stored on node D 223 while clock signal 214 is de-asserted.

The first shared node is de-coupled from the ground reference node (block 909). Shared node X 225 is de-coupled from the ground reference node, via device Q 809 while clock signal 214 is de-asserted. The de-coupling of shared node X 225 from the ground reference node may allow changes in the value of input signal 211 to propagate into master latch 230.

The second shared node is de-coupled from the ground reference node (block 910). Similar to shared node X 225, shared node Y 226 is de-coupled from the ground reference node, via device 815 while clock signal 214 is de-asserted. De-coupling shared node Y 226 from the ground reference node may contribute to slave latch 231 storing the value of the outputs of master latch 230.

It is noted that the method illustrated in FIG. 9 is merely an example. In other embodiments, additional operations may be included or some operations may be performed in a different order or in parallel. For example, although operations 905, 906, and 907 are shown as occurring in sequence, these operations may occur in any order, including in parallel.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a master latch circuit including a first circuit and a second circuit, wherein the first circuit and the second circuit are coupled to a first shared circuit node, and wherein the master latch circuit is configured to store a value of an input signal in response to an assertion of a clock signal; and
   a slave latch circuit including a third circuit and a fourth circuit, wherein the third circuit and the fourth circuit are coupled to a second shared circuit node, and wherein the slave latch circuit is configured to store an output value of the master latch circuit in response to a de-assertion of the clock signal;
   wherein the master latch circuit is further configured to de-couple the first shared circuit node from a ground reference node in response to the de-assertion of the clock signal; and
   wherein the slave latch circuit is further configured to de-couple the second shared circuit node from the ground reference node in response to the de-assertion of the clock signal.

2. The apparatus of claim 1, wherein the master latch circuit is further configured to couple the first shared circuit node to the ground reference node in response to the assertion of the clock signal.

3. The apparatus of claim 1, wherein to store the output value of the master latch circuit in response to the de-assertion of the clock signal, the slave latch circuit is further configured to combine the clock signal and the output value of the master latch circuit using a logical AND function.

4. The apparatus of claim 3, wherein to store the output value of the master latch circuit in response to the de-assertion of the clock signal, the slave latch circuit is further configured to combine an output of the slave latch circuit and a result of the logical AND function using a logical NOR function.

5. The apparatus of claim 1, wherein to store the value of the input signal in response to the assertion of the clock signal, the master latch circuit is further configured to combine the clock signal and the output value of the master latch circuit using a logical AND function.

6. The apparatus of claim 5, wherein to store the value of the input signal in response to the assertion of the clock signal, the master latch circuit is further configured to combine the input signal and a result of the logical AND function using a logical OR function.

7. The apparatus of claim 1, wherein to de-couple the first shared circuit node from the ground reference node comprises de-asserting a control gate of a transistor coupled to the first shared circuit node and the ground reference node.

8. A method comprising:
coupling a first circuit and a second circuit of a master latch circuit to a first shared circuit node;
coupling a third circuit and a fourth circuit of a slave latch circuit to a second shared circuit node;
storing, by the master latch circuit, a value of an input signal in response to an assertion of a clock signal;
storing, by the slave latch circuit, an output value of the master latch circuit in response to a de-assertion of the clock signal;
de-coupling, by the master latch circuit, the first shared circuit node from a ground reference node in response to the de-assertion of the clock signal; and
de-coupling, by the slave latch circuit, the second shared circuit node from the ground reference node in response to the de-assertion of the clock signal.

9. The method of claim 8, further comprising coupling, by the master latch circuit, the first shared circuit node to the ground reference node in response to the assertion of the clock signal.

10. The method of claim 8, wherein storing the output value of the master latch circuit in response to the de-assertion of the clock signal comprises combining, by the slave latch circuit, the clock signal and the output value of the master latch circuit using a logical AND operation.

11. The method of claim 10, wherein storing the output value of the master latch circuit in response to the de-assertion of the clock signal comprises combining, by the slave latch circuit, an output value of the slave latch circuit and a result of the logical AND operation using a logical NOR operation.

12. The method of claim 8, wherein storing the value of the input signal in response to the assertion of the clock signal comprises combining, by the master latch circuit, the clock signal and the output value of the master latch circuit using a logical AND operation.

13. The method of claim 12, wherein storing the value of the input signal in response to the assertion of the clock signal comprises combining, by the master latch circuit, the input signal and a result of the logical AND operation using a logical NOR operation.

14. The method of claim 8, wherein to de-couple the first shared circuit node from the ground reference node comprises de-asserting a control gate of a transistor coupled to the first shared circuit node and the ground reference node.

15. A system, comprising:
a clock source configured to generate a clock signal;
a circuit block configured to generate a data signal; and
a flip-flop circuit including a master latch circuit and a slave latch circuit, wherein the master latch circuit includes a first circuit and a second circuit coupled to a first shared circuit node, wherein the slave latch circuit includes a third circuit and a fourth circuit coupled to a second shared circuit node, and wherein the flip-flop circuit is configured to:
store a value of an input signal in the master latch circuit in response to an assertion of a clock signal;
store an output value of the master latch circuit in the slave latch circuit in response to a de-assertion of the clock signal; and
de-couple the first shared circuit node from a ground reference node in response to the de-assertion of the clock signal; and
de-couple the second shared circuit node from the ground reference node in response to the de-assertion of the clock signal.

16. The system of claim 15, wherein the flip-flop circuit is further configured to couple the first shared circuit node to the ground reference node in response to the assertion of the clock signal.

17. The system of claim 15, wherein to store the output value of the master latch circuit in the slave latch circuit, the flip-flop circuit is further configured to combine the clock signal and the output value of the master latch circuit using a logical AND function.

18. The system of claim 17, wherein to store the output value of the master latch circuit in the slave latch circuit, the flip-flop circuit is further configured to combine an output value of the slave latch circuit and a result of the logical AND function using a logical NOR function.

19. The system of claim 15, wherein to store the value of the input signal in the master latch circuit, the flip-flop circuit is further configured to combine the clock signal and the output value of the master latch circuit using a logical AND function.

20. The system of claim 19, wherein to store the value of the input signal in the master latch circuit, the flip-flop circuit is further configured to combine the input signal and a result of the logical AND function using a logical NOR function.

* * * * *